(12) United States Patent
Schlenker et al.

(10) Patent No.: US 7,864,024 B2
(45) Date of Patent: Jan. 4, 2011

(54) ELECTRONIC ASSEMBLY HAVING SPRING-LOADED CONTACT BRIDGE WITH FUSE FUNCTION

(75) Inventors: Roberto Schlenker, Ingolstadt (DE);
Michael Nagel, Nuremberg (DE);
Juergen Martin, Ingolstadt (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 0 days.

(21) Appl. No.: 11/886,755

(22) PCT Filed: Mar. 28, 2006

(86) PCT No.: PCT/DE2006/000550

§ 371 (c)(1),
(2), (4) Date: Sep. 19, 2007

(87) PCT Pub. No.: WO2006/102876

PCT Pub. Date: Oct. 5, 2006

(65) Prior Publication Data

US 2009/0027156 A1    Jan. 29, 2009

(30) Foreign Application Priority Data

Mar. 31, 2005    (DE) .................. 10 2005 014 601

(51) Int. Cl.
*H01H 85/36* (2006.01)
*H01H 37/76* (2006.01)

(52) U.S. Cl. ................. 337/407; 337/239; 337/401; 337/404

(58) Field of Classification Search ................. 337/401, 337/404, 239, 407
See application file for complete search history.

(56) References Cited

U.S. PATENT DOCUMENTS

| | | | | |
|---|---|---|---|---|
| 3,763,454 A | * | 10/1973 | Zandonatti | 337/404 |
| 4,186,366 A | * | 1/1980 | McVey | 337/407 |
| 4,441,093 A | * | 4/1984 | Okazaki | 337/404 |
| 4,486,804 A | * | 12/1984 | Watson et al. | 361/104 |
| 4,527,144 A | * | 7/1985 | Arikawa | 337/407 |
| 5,014,036 A | * | 5/1991 | Komoto | 337/407 |
| 5,153,805 A | * | 10/1992 | Tennant et al. | 361/27 |
| 5,192,937 A | * | 3/1993 | Lee | 337/104 |
| 5,280,262 A | * | 1/1994 | Fischer | 337/405 |
| 5,311,164 A | * | 5/1994 | Ikeda et al. | 337/28 |
| 5,550,527 A | * | 8/1996 | Lee | 338/50 |
| 5,563,570 A | * | 10/1996 | Lee | 338/50 |

(Continued)

FOREIGN PATENT DOCUMENTS

DE        20 58 357        6/1972

(Continued)

*Primary Examiner*—Anatoly Vortman
(74) *Attorney, Agent, or Firm*—W. F. Fasse; W. G. Fasse

(57) ABSTRACT

An electronic assembly includes an electronic circuit on a circuit board. The circuit includes a conductor path on the circuit board, and at least one SMD component, electronic component and/or electromechanical component that is mounted on the circuit board and connected to the conductor path. A circuit connection between any two of the conductor paths and/or the components is established via a soldered joint and a spring-loaded contact bridge. In the event of excessive power dissipation, the soldered joint melts or weakens and the contact bridge opens due to the spring force.

19 Claims, 2 Drawing Sheets

U.S. PATENT DOCUMENTS

| | | | |
|---|---|---|---|
| 5,600,295 A | | 2/1997 | Kaufmann |
| 5,612,662 A | | 3/1997 | Drekmeier et al. |
| 5,770,993 A | | 6/1998 | Miyazawa et al. |
| 5,831,507 A | * | 11/1998 | Kasamatsu et al. ............. 337/4 |
| 5,896,080 A | | 4/1999 | Chen |
| 5,982,270 A | * | 11/1999 | Wolfe et al. ................. 337/401 |
| 5,999,391 A | | 12/1999 | Lou et al. |
| 6,342,827 B1 | * | 1/2002 | Buhrend et al. ............. 337/365 |
| 6,445,277 B1 | * | 9/2002 | Ishikawa et al. ............ 337/297 |
| 6,741,159 B1 | * | 5/2004 | Kuczynski ................. 337/403 |
| 7,002,785 B1 | | 2/2006 | Bothe et al. |
| 7,023,674 B2 | * | 4/2006 | Gross et al. .................. 361/23 |
| 7,345,570 B2 | * | 3/2008 | Kawanishi .................. 337/142 |
| 7,471,498 B2 | * | 12/2008 | Lavene et al. ............ 361/274.1 |

FOREIGN PATENT DOCUMENTS

| | | |
|---|---|---|
| DE | 75 20 602 | 10/1975 |
| DE | 39 30 819 | 3/1991 |
| DE | 42 19 554 | 12/1993 |
| DE | 196 39 427 | 3/1997 |
| DE | 196 47 035 | 11/1997 |
| DE | 102224014660 | 7/2005 |
| JP | 09-306318 | 11/1997 |

* cited by examiner

ELECTRONIC ASSEMBLY HAVING SPRING-LOADED CONTACT BRIDGE WITH FUSE FUNCTION

FIELD OF THE INVENTION

The invention relates to an electronic assembly with a circuit board that is provided with conductor strips or paths and, for forming an electronic circuit, is equipped with a number of SMD ("Surface Mounted Device") components and/or further electronic and/or electromechanical elements while using a suitable solder.

BACKGROUND INFORMATION

Such electronic assemblies can especially be provided for an application in electronic control devices, for example in driving dynamics regulators, ESP systems or ABS regulators. Depending on the application purpose, with such assemblies an unacceptably high loss power dissipation could arise in the assembly due to faulty components such as switching transistors for example, due to circuit board short circuits, or due to water penetration. In severe cases, this power dissipation could (lead) to the total destruction of the circuit board.

SUMMARY OF THE INVENTION

Therefore, the underlying object of the invention is to set forth an electronic assembly of the abovementioned type, which is secured to a high degree by simple means against a possible occurrence of high power dissipation.

This object is achieved according to the invention in that a number of connections between conductor strips, components and/or elements on the circuit board is provided respectively via a spring-loaded contact bridge or bail.

Thereby the invention begins from the consideration that an assembly secured to an especially high degree against the occurrence of a power dissipation should be designed for the most immediate as possible and the most automatic as possible suppression and elimination. In that regard, in connection with the elevated temperatures arising due to the power dissipation, the increased power dissipation of defective components or the like, which contribute to the occurrence of fire, should be directly eliminated as quickly as possible. Therefore, for a rapid switching-off of the electrical current, a fuse should be provided, which interrupts the electrical connection between the affected conductor strips and/or components or elements in a sudden jump-like manner at elevated temperatures of for example more than about 180° C. In order to make this possible, the realization is utilized, that the solder materials used in the mounting of components or the like on the circuit board typically begin to melt upon the occurrence of such elevated temperatures. In order to make use of this for the abovementioned safety or fuse purposes, the circuit board should be provided with contact bridges or bails that interrupt the connection between conductor strips or the like upon the melting of the solder material. For this purpose, the contact bridges are embodied in a spring-loaded manner, so that an automatic or self-actuating release of the connection arises through the respective contact bridge due to the provided spring force when the mechanical connection yields due to the softening of the solder. In that regard, the contact bridge includes a springing element that separates the contact bridge from the circuit board in a sudden jump-like manner as soon as the utilized solder falls below a minimum strength.

In that regard, the contact bridge could also be mounted through the use of other suitable materials by which it is ensured that the mechanical connection to the contact bridge is released and therewith this contact bridge can open while interrupting the current-side connection upon reaching or exceeding a prescribable minimum temperature. Preferably, however, the contact bridge is mounted through the use of the solder that is used for mounting the components on the circuit board, so that the arising melting of the solder at sufficiently high temperatures can be utilized for triggering the safety or fuse function via the contact bridge.

In order to ensure a reliable interruption, when needed, of the electrical connection established by the contact bridge between the respective conductor strips and/or components, the contact bridge is advantageously loaded with a sufficiently high spring force. For that purpose, the contact bridge can be loaded or impinged upon by an allocated compression spring in an advantageous embodiment. This compression spring, especially embodied as a separate component, is advantageously adapted with respect to its dimensioning parameters, such as especially the spring force, the allocated spring travel, and the like, to the provided installation location and to the forces required for a reliable opening of the contact bridge in a case when needed.

In such an embodiment, the compression spring can especially be guided or passed through an allocated hole or a bore in the circuit board, whereby the compression spring is counter-supported preferably on a housing wall, for example a housing floor. In such a construction, the contact bridge can be mounted especially in a zero force or force-less manner and without pre-stressing while utilizing conventional SMD technologies, because no special additional forces must be applied for fixing the contact bridge during the mounting. In a subsequent mounting step, the compression spring that is counter-supported in the housing floor or a similar further component can then be guided or passed through the hole in the circuit board located under the contact bridge and mounted with a pre-stress.

Alternatively or additionally, the respective contact bridge is fabricated to be springy and is mounted with an internal pre-stress. In such an embodiment, an especially simple construction is made possible, especially because no further separate components beyond the contact bridge are required. In that regard, the contact bridge can be embodied in such a manner so that it receives its internal pre-stressing already during the mounting. However, in order to also be able to mount the contact bridge in a SMD technology, the mounting of the contact bridge on the circuit board should be possible without additional clamping or stressing forces or the like. For that purpose, the contact bridge is advantageously fabricated to be springy and designed for a stress-free mounting, whereby an internal pre-stressing is applied after the mounting by a suitable deformation of the contact bridge.

For an especially reliable safety or fuse function, the electronic assembly is advantageously designed in such a manner so that the current supply to the circuit board or to individual components is interrupted in a targeted manner upon the occurrence of an unexpected temperature increase, because thereby the power dissipation can be reduced especially effectively and quickly. In order to ensure this, at least one of the contact bridges is advantageously mounted on a supply conductor strip through which a current feed or supply to the components mounted on the circuit board is carried out.

For a production effort and expense that is held especially small, for producing the assembly, the components thereof and especially also the contact bridges are advantageously designed for a mountability with use of typical solder and mounting methods. In that regard, in order to especially make use of conventional and cost-advantageous mounting concepts, the or each contact bridge is advantageously configured in such a manner that it is insertable in an automated mounting process. For that purpose, the respective contact bridge is advantageously formed in such a manner that it can be supplied in a belted or magazined manner like per se known SMD components to a conventional automatic mounting machine or robot.

Due to the achievable high safety standard of the electronic assembly with respect to high power dissipation and damages caused thereby, such as destruction or disruption of the circuit board for example, the assembly is especially suitable for application in a motor vehicle. Advantageously, in that regard, the electronic assembly is used in an ABS or ESP system of a motor vehicle.

The advantages achieved with the invention especially consist in that, through the provision of spring-loaded contact bridges for the production of electrical connections between conductor strips and/or components on the circuit board, upon the occurrence of increased temperatures a melting of the connection location of the contact bridge to the circuit board and associated therewith, due to the springy embodiment, an abrupt interruption of the electrical connection produced by the contact bridge is achievable. Thereby the energy supply to the circuit board in total or to individual components can be interrupted reliably, abruptly and quickly on the assembly, as soon as an unexpected temperature increase occurs. Thereby resultant damages due to increased power dissipation in the assembly are surely avoided.

BRIEF DESCRIPTION OF THE DRAWINGS

An example embodiment of the invention will be explained more closely in connection with the drawing. Therein.

DETAILED DESCRIPTION OF EXAMPLE EMBODIMENTS OF THE INVENTION

The same parts are provided with the same reference numbers in all figures.

Figure 1:
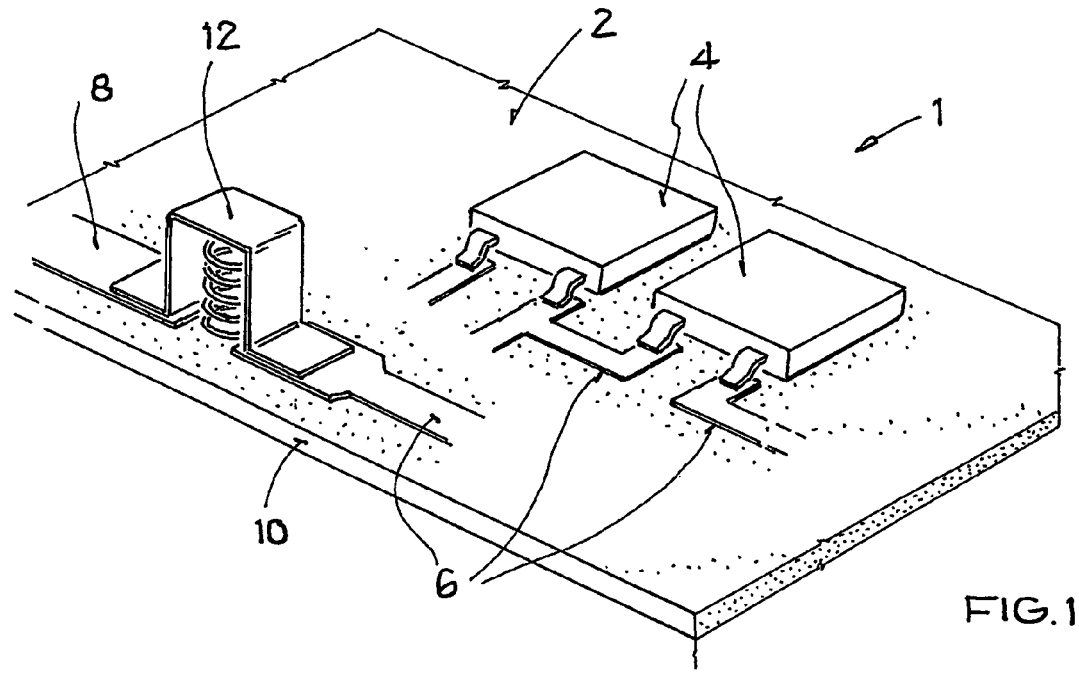
FIG. 1 schematically shows an electronic assembly.

The electronic assembly 1 schematically illustrated in FIG. 1 is especially provided for use in electronic control devices, such as for example in driving dynamics regulators, ABS regulators, ESP systems or other vehicle control devices of a motor vehicle. It encompasses a circuit board 2 that is equipped with a number of application-specifically embodied SMD components 4 and further electronic and/or electromechanical elements. The SMD components 4 and if applicable the further elements are mounted on the circuit board 2 through use of a suitable solder and are suitably connected with one another via a plurality of conductor strips or paths 6, of which only a few are illustrated in an exemplary manner in the example embodiment.

In that regard, the circuit board 2 can be embodied as a simple or single circuit board or also as a circuit board with several wiring planes, such as for example a two-layer, four-layer or multi-layer. For supplying the active components with voltage and/or current, the circuit board 2 additionally comprises a number of conductor strips or paths 6 that are embodied as so-called supply conductor strips 8. These are especially embodied to be suitable for the connection of an external voltage supply. In view of this application purpose, the supply conductor strips 8 are suitably selected especially with respect to their material and their dimensioning.

Due to its design, the circuit board 2 is secured against a possible occurrence of high power dissipation. For this purpose, a number of connections between conductor strips 6, components 4 and/or elements is produced respectively via a spring-loaded contact bail or bridge 12, of which only one is illustrated in FIG. 1. Of course, still further contact bridges 12 can also be positioned at suitable locations of the circuit board 2 depending on the requirements, design and architecture of the assembly 1. The contact bridge 12 is mounted on the circuit board 2 through use of the solder that is also used for mounting the components 4 and further elements. Thereby it is ensured that the strength of the connection of the contact bridge 12 with the circuit board 2 is gravely reduced upon arising temperatures of more than the melting temperature of this solder (for example about 180° C.). Through the loading of the contact bridge 12 with a suitable pre-stress, in this case an abrupt or jump-like releasing of the contact bridge 12 from the circuit board 2 occurs, so that the connection established through the contact bridge 12 is instantaneously interrupted. In the example embodiment according to FIG. 1, in which the contact bridge 12 illustrated there is circuit-connected in a supply conductor strip 8, in this case thereby the current supply of the circuit board 2 is directly interrupted, so that high power dissipation is immediately prevented.

Figure 2:
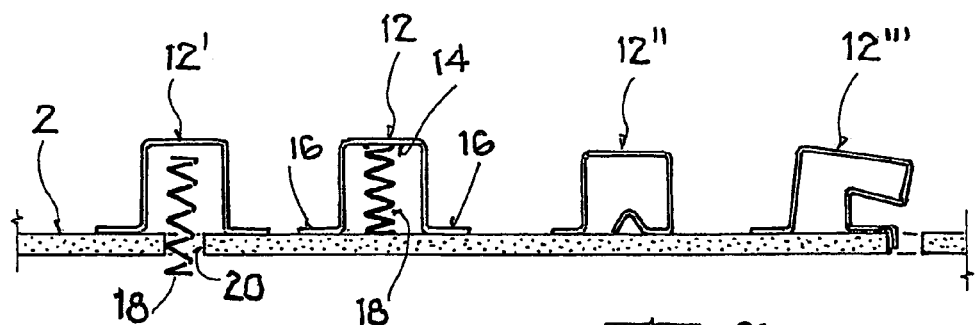
FIG. 2 shows an embodiment of a circuit board of the assembly according to FIG. 1 in a longitudinal section.

In the example embodiment according to FIG. 2, various different preferred variants for mounting of the contact bridge 12 on the circuit board 2 are schematically illustrated. The contact bridge 12, which corresponds in its embodiment or design with that shown in FIG. 1, comprises a metallic base body 14 that is soldered at its ends 16 to the circuit board 2. A compression spring 18 is arranged within the base body 14, whereby the compression spring 18 is mounted under a pre-stress and braces itself on one side on the base body 14 and on the other side on the circuit board 2. Thereby, through the compression spring 18, a sufficiently dimensioned pre-stress is applied that (will) lead to a loosening or releasing of the base body 14 from the circuit board 2 in connection with a weakening of the connection of the ends 16 to the circuit board 2.

The contact bridge 12' is similar in its embodiment or design to the contact bridge 12, whereby in this case the compression spring 18 however is guided or passed through an allocated hole 20 in the circuit board 2.

The alternative embodiment of the contact bridge 12" is, in contrast, embodied in a one-piece manner without use of a separate compression spring. In that regard, the contact bridge 12" is formed of a springy base body 14, that comprises a suitable internal pre-stress through its form or structure. In that regard, the contact bridge 12" is suitably formed and pre-stressed already in the fabrication step, and is mounted under or with this pre-stress on the circuit board 2.

In contrast, the contact bridge 12''', which is similarly embodied without further components and without an external compression spring, is initially fabricated in a pre-stress-less manner, so that it is mountable in an especially simple manner also with SMD technology. Subsequently the contact bridge 12''' is deformed in the already mounted state for producing the desired spring loading or pre-stress, whereby for example a suitably positioned pressing die or stamp can be utilized.

Figure 3A:
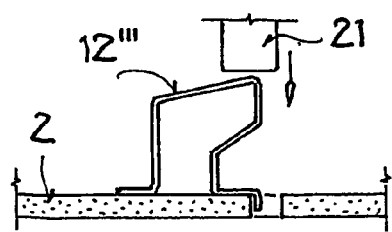
FIGS. 3a, 3b show a contact bridge of the circuit board according to FIG. 2 in a detail view.

Further details of the variants of the contact bridge 12 are shown in FIGS. 3 and 4. FIG. 3a shows the contact bridge 12''' directly before its mounting. The contact bridge 12''' in that regard is already secured on the circuit board 2, but still comprises its un-deformed basic original shape. In this condition or state, the contact bridge 12''' can be soldered onto the circuit board 2 without pre-stress and correspondingly without any significant external forces. In order to thereafter impress the pre-stress that is desired for the safety or fuse purposes onto the contact bridge 12''', it is suitably deformed by a pressing die or stamp 21. For that purpose, the pressing die or stamp 21 is moved suitably in the direction of the illustrated arrow.

Figure 3B:
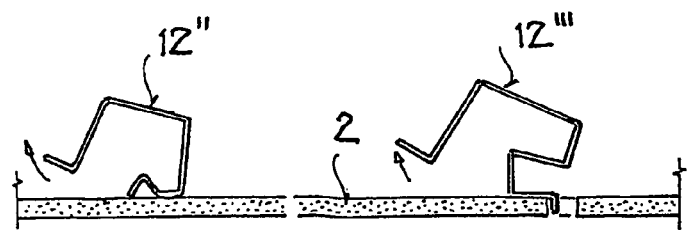

In contrast, FIG. 3*b* shows the contact bridges 12'' and 12''' after the case of triggering, thus after undesirably high temperatures have arisen. This leads to the start of melting of the solder with which the contact bridges 12'', 12''' are respectively fixed on the circuit board 2. As a result of the impressed pre-stress, this securing or connection no longer holds fast upon a softening of the solder, so that the contact bridge 12'', 12''' respectively releases in an abrupt jump-like manner and interrupts the electrical connection established by it.

Figure 4A:
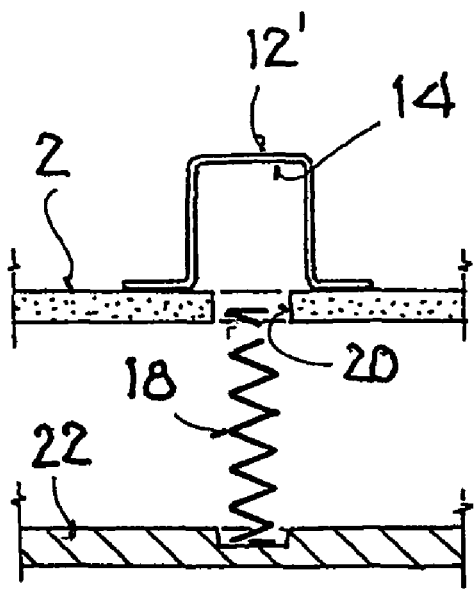
FIGS. 4a to 4c respectively show a contact bridge in partial views.

FIG. 4*a* shows the contact bridge 12' directly before its mounting. As can be seen there, the base body 14 of the contact bridge 12' is first mounted in a pre-stress-less manner on the circuit board 2, so that this can especially be carried out with conventional SMD mounting methods. Subsequently the compression spring 18 is passed through the hole 20 in the circuit board 2. In that regard, the compression spring 18 is counter-supported on a housing wall 22, for example a housing floor. Thus, by setting the circuit board 2 onto the housing wall 22, the compression spring 18 is brought into contact with the base body 14 of the contact bridge 12', so that the provided spring-loading or pre-stressing arises for the contact bridge 12'.

Figure 4B:
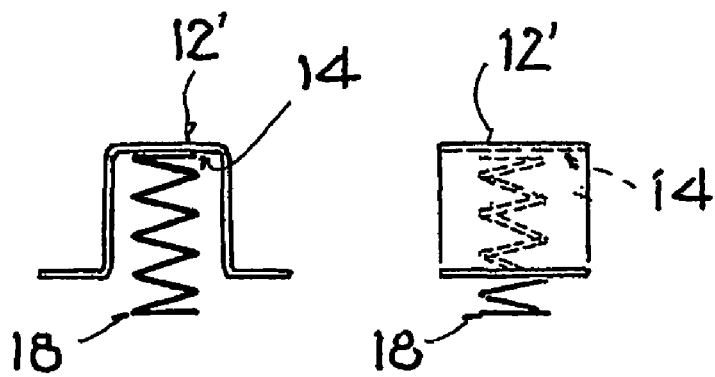
Figure 4C:
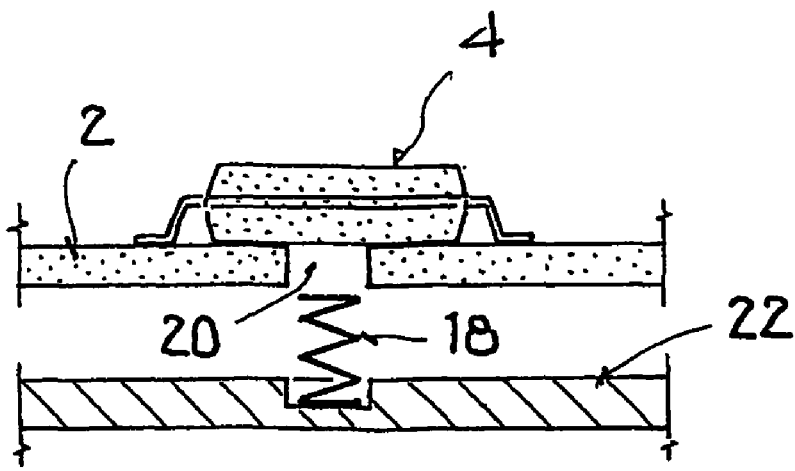

In FIG. 4*b*, the contact bridge 12' is shown in a partial view in a mounted condition in side and front views. Thereby it can be recognized that the compression spring 18 lies against the upper surface of the base body 14 in the mounted condition.

Fundamentally, the safety or fuse function with respect to increased temperatures achieved by the spring-loading or use of a pre-stressed compression spring 18 can basically also analogously be achieved by corresponding mounting of components. This is shown by way of example in FIG. 4*c*. There an SMD component 4 is mounted with use of a suitable solder on the upper surface of the circuit board 2. Also here a compression spring 18 is guided or passed through an allocated hole 20, and the compression spring 18 is counter-supported on a housing wall 22. Through the thusly achievable spring-loaded mounting of the SMD component 4, also this component can thus be lifted away from the circuit board 2 in the case of a temperature increase and a softening of the solder associated therewith, so that the current supply to the component 4 is prevented.

REFERENCE NUMBER LIST

1 electronic assembly
2 circuit board
4 SMD component
6 conductor strip or path
8 supply conductor strip
10 base body
12, 12',
12'', 12''' contact bridge or bail
14 base body
16 ends
18 compression spring
20 hole in the circuit board 2
21 pressing die or stamp
22 housing wall

The invention claimed is:

1. Electronic assembly with a circuit board that is provided with conductor strips and, for forming an electronic circuit, is equipped with a number of SMD components and/or further electronic and/or electromechanical elements through use of a suitable solder, whereby a number of connections between conductor strips, components and/or elements is produced via respectively a contact bridge, wherein the respective contact bridge or a respective one of the SMD components or further electronic and/or electromechanical elements is spring-loaded by being impinged upon with an allocated compression spring that passes through the circuit board and is counter-supported on a wall element of the electronic assembly.

2. Electronic assembly according to claim 1, in which the respective contact bridge is mounted through use of the solder.

3. Electronic assembly according to claim 1, in which the wall element is a housing wall of a housing of the electronic assembly.

4. Electronic assembly according to claim 3, wherein the respective contact bridge is spring-loaded by being impinged upon with the compression spring.

5. Electronic assembly according to claim 3, wherein the respective one of the SMD components or further electronic and/or electromechanical elements is spring-loaded by being impinged upon with the compression spring.

6. Electronic assembly according to claim 1, wherein the respective contact bridge is spring-loaded by being impinged upon with the compression spring.

7. Electronic assembly according to claim 1, wherein the respective one of the SMD components or further electronic and/or electromechanical elements is spring-loaded by being impinged upon with the compression spring.

8. Electronic assembly according to claim 1, in which at least one of the contact bridges is mounted on a supply conductor strip.

9. Electronic assembly according to claim 1, wherein the compression spring is a helical coil compression spring.

10. An ABS or ESP system of a motor vehicle comprising an electronic assembly according to claim 1.

11. An electronic assembly comprising:
a circuit board with a hole passing therethrough;
a wall element adjacent to said circuit board;
a conductor strip on said circuit board;
components selected from surface mounted device (SMD) components, electronic components and electromechanical components on said circuit board;
a contact bridge;
a solder material that electrically and mechanically connects said contact bridge or one of said components to said conductor strip; and
a compression spring that is counter-supported on said wall element, passes through said hole in said circuit board, and impinges on said contact bridge or said one of said components that is electrically and mechanically connected to said conductor strip by said solder material.

12. The electronic assembly according to claim 11, wherein said contact bridge is mounted on said circuit board and is electrically and mechanically connected to said conductor strip by said solder material, and wherein said compression spring impinges on said contact bridge.

13. The electronic assembly according to claim 12, wherein said wall element is a housing wall of a housing of said electronic assembly.

14. The electronic assembly according to claim 11, wherein said one of said components is mounted on said circuit board and is electrically and mechanically connected to said conductor strip by said solder material, and wherein said compression spring impinges on said one of said components.

15. The electronic assembly according to claim 14, wherein said wall element is a housing wall of a housing of said electronic assembly.

16. The electronic assembly according to claim 11, wherein said wall element is a housing wall of a housing of said electronic assembly.

17. The electronic assembly according to claim 11, wherein said conductor strip is a power supply conductor strip.

18. The electronic assembly according to claim 11, wherein said compression spring is a helical coil compression spring.

19. A method of assembling the electronic assembly according to claim 11, comprising the steps:
a) soldering said contact bridge or said one of said components onto said conductor strip with said solder material; and
b) after said step a), installing said compression spring so that said compression spring is counter-supported on said wall element, passes through said hole in said circuit board, and impinges on said contact bridge or said one of said components.

* * * * *